US012706127B2

(12) United States Patent
Bueb et al.

(10) Patent No.: US 12,706,127 B2
(45) Date of Patent: Aug. 11, 2026

(54) MEMORY DEVICE HEATING IN COLD ENVIRONMENTS

(71) Applicant: Micron Technology, Inc., Boise, ID (US)

(72) Inventors: Christopher Joseph Bueb, Folsom, CA (US); Poorna Kale, Folsom, CA (US); Aravind Ramamoorthy, Rocklin, CA (US)

(73) Assignee: Micron Technology, Inc., Boise, ID (US)

( * ) Notice: Subject to any disclaimer, the term of this patent is extended or adjusted under 35 U.S.C. 154(b) by 174 days.

(21) Appl. No.: 18/516,769

(22) Filed: Nov. 21, 2023

(65) Prior Publication Data

US 2024/0170029 A1 May 23, 2024

Related U.S. Application Data

(60) Provisional application No. 63/427,379, filed on Nov. 22, 2022.

(51) Int. Cl.
*G11C 7/04* (2006.01)
*G11C 7/20* (2006.01)
*H10N 70/00* (2023.01)

(52) U.S. Cl.
CPC .................. *G11C 7/04* (2013.01); *G11C 7/20* (2013.01); *H10N 70/861* (2023.02)

(58) Field of Classification Search
CPC ........... G11C 7/04; G11C 7/20; H10N 70/861
See application file for complete search history.

(56) References Cited

U.S. PATENT DOCUMENTS 8,958,242 B2 * 2/2015 Vanalli .................. G11C 16/26 219/209
9,384,846 B1 * 7/2016 Shim ........................ G11C 7/04
2006/0056255 A1 * 3/2006 Dortu .................... G11C 11/406 365/222
2013/0151833 A1 * 6/2013 Chiu .................. G06F 11/3024 713/2
2015/0043266 A1 * 2/2015 Youn ................. G11C 13/0021 365/148
2015/0301932 A1 * 10/2015 Oh .......................... G06F 13/00 711/102
2016/0099049 A1 * 4/2016 Lee .................... G11C 13/0064 365/148
2016/0239235 A1 * 8/2016 Chung ..................... G11C 7/04

(Continued)

*Primary Examiner* — Khamdan N. Alrobaie
(74) *Attorney, Agent, or Firm* — Holland & Hart LLP

(57) ABSTRACT

Methods, systems, and devices for memory device heating in cold environments are described. A memory system may use system components to accelerate the heating of a non-volatile memory device that stores boot data associated with a boot up procedure at a host system. For example, the memory system may determine that a temperature associated with the memory system fails to satisfy a threshold. Based on the temperature failing to satisfy the threshold, a controller of the memory system may perform a heating procedure that increases a heat of and emitted by the controller (e.g., a heating element coupled with the controller) to accelerate the heating of the non-volatile memory device. The memory system may read the boot data from the non-volatile memory device based on the heating procedure and transmit the boot data to the host system.

19 Claims, 7 Drawing Sheets

(56) References Cited

U.S. PATENT DOCUMENTS

| | | | | |
|---|---|---|---|---|
| 2017/0071056 | A1* | 3/2017 | Stoev | G11C 7/04 |
| 2017/0090822 | A1* | 3/2017 | Yadav | G06F 3/0653 |
| 2020/0073451 | A1* | 3/2020 | Nowell | G11C 11/5628 |
| 2020/0126612 | A1* | 4/2020 | Mayer | G11C 11/409 |
| 2021/0240381 | A1* | 8/2021 | Sato | G11C 11/5628 |
| 2022/0068398 | A1* | 3/2022 | Bueb | G11C 11/5628 |
| 2022/0375510 | A1* | 11/2022 | Wu | G06F 11/3058 |
| 2024/0053905 | A1* | 2/2024 | Basu | G11C 7/1006 |
| 2024/0202071 | A1* | 6/2024 | Xotta | G06F 11/0772 |

* cited by examiner

500

600

MEMORY DEVICE HEATING IN COLD ENVIRONMENTS

CROSS REFERENCE

The present application for patent claims priority to U.S. Patent Application No. 63/427,379 by Bueb et al., entitled "MEMORY DEVICE HEATING IN COLD ENVIRONMENTS," filed Nov. 22, 2022, which is assigned to the assignee hereof, and which is expressly incorporated by reference herein.

FIELD OF TECHNOLOGY

The following relates to one or more systems for memory, including memory device heating in cold environments.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read (e.g., sense, detect, retrieve, identify, determine, evaluate) the state of one or more memory cells within the memory device. To store information, a component may write (e.g., program, set, assign) one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be described in terms of volatile configurations or non-volatile configurations. Volatile memory cells (e.g., DRAM) may lose their programmed states over time unless they are periodically refreshed by an external power source. Non-volatile memory cells (e.g., NAND) may maintain their programmed states for extended periods of time even in the absence of an external power source.

DETAILED DESCRIPTION

Figure 1:
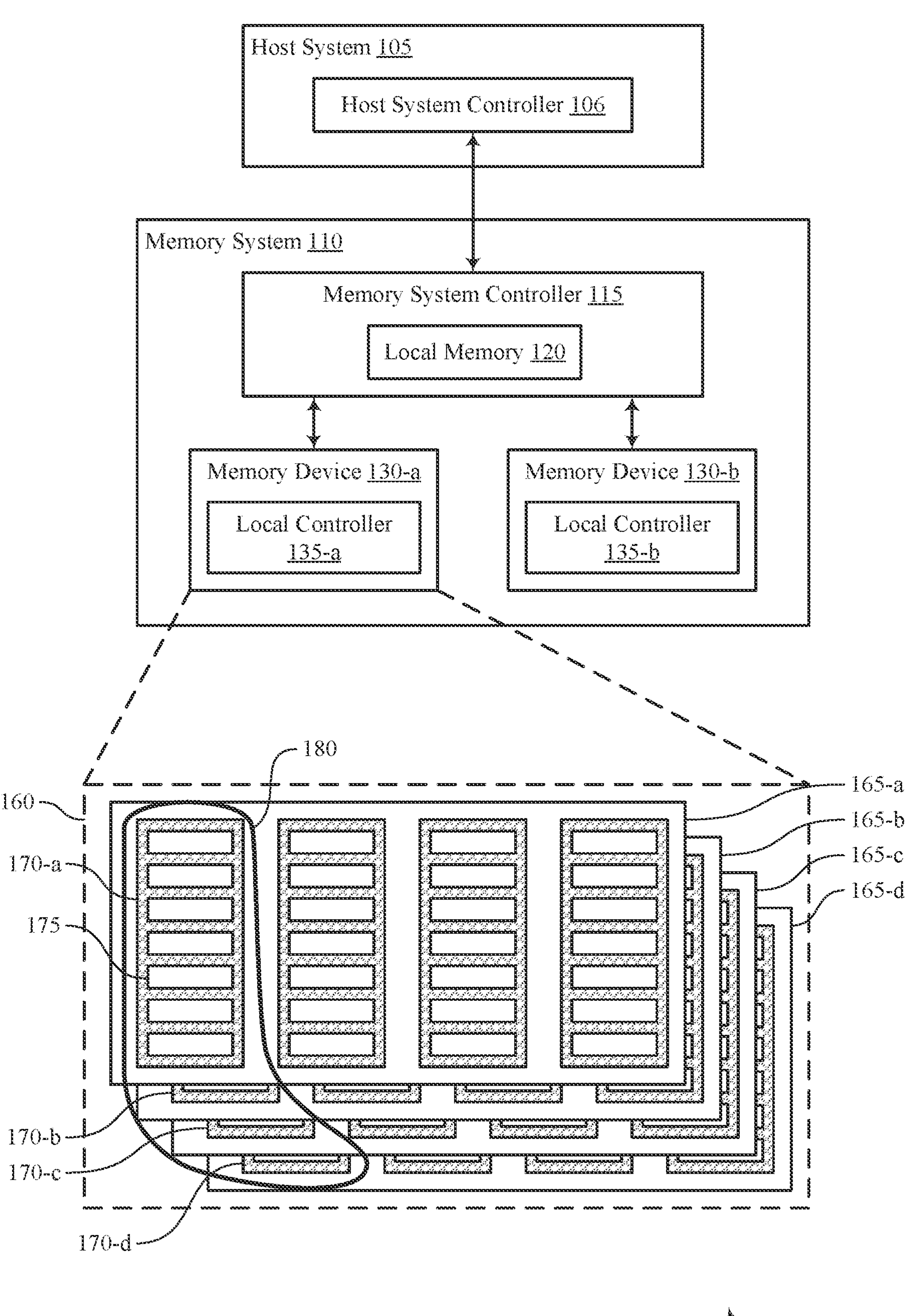
FIGS. 1, 2, 3, 4, and 5 illustrate examples of systems that support memory device heating in cold environments in accordance with examples as disclosed herein.

Many applications of non-volatile memory devices may place these devices into environments in which the devices encounter cold temperatures. Such cold temperatures may reduce an operational reliability of these devices (e.g., increase a bit error rate of information written to or read from these devices) until the devices are permitted to warm up to more favorable operating temperatures. Automobiles are one application in which non-volatile memory devices may encounter colder temperatures, especially when the automobiles are first started in winter environments. The operation of an internal combustion engine in the automobile causes ambient temperatures to rise, thereby resulting in the warming of some electronic devices into a temperature range having acceptable reliability and performance. Additionally or alternatively, the operation of some electronic devices may generate external heating to nearby systems and components. These operating facts may provide an effective mechanism to permit non-volatile memory devices to operate in colder environments.

Some non-volatile memory devices (e.g., memory devices including non-volatile quad-level cells (QLCs) configured to each store four bits of information) used in storage devices may be less reliable at extremely cold temperatures (e.g., −40° C., among other cold temperatures). But some systems that include non-volatile memory devices, such as those implemented in an automobile, may be operated before operational self-heating increases the operating temperature of the memory devices to a more reliable level. For example, these systems may be operated during the operational self-heating time period when the automobile is first started (e.g., before the operational self-heating time period has ended). However, data read from a non-volatile memory device before the operational self-heating time period has ended may be less reliable (e.g., more error-prone) such that operation of the systems may fail or be delayed until after the operational self-heating time period has ended.

For instance, one or more non-volatile memory devices may store data (e.g., boot code) used by a computing device (e.g., a host system) to control operation of one or more systems of the vehicle, such as an engine and a transmission. When the vehicle is started, the computing device may boot up from an off state (e.g., a shutdown state, a power-down state) by reading boot code (e.g., boot data, initialization code) to be executed when the vehicle is started to support the operation of the vehicle systems. The one or more memory devices may be accessed to retrieve the boot code, however, cold operating temperatures of the one or more non-volatile memory devices may cause an increase of bit error rates of one or more access operations to retrieve the boot code such that booting up of the computing device may fail. The bit error rates of these access operations may decrease as the one or more non-volatile memory devices warm to higher operating temperatures. But in some cases, until this warming of the memory devices occurs, boot operation may be delayed until the memory devices warm to support the provision of accurate boot code and related data.

Implementations described herein address the aforementioned shortcomings and other shortcomings by providing a memory system that utilizes system components to accelerate a self-heating process for one or more non-volatile memory devices critical to operation of the systems in which the devices operate. This acceleration of self-heating at cold temperatures may occur by placing the one or more non-volatile memory devices near a controller of the memory system. For example, in cold temperatures, the controller may perform a heating procedure that increases a heat of and emitted by the controller (e.g., a heating element coupled with the controller), which may in turn accelerate a heating of the one or more non-volatile memory devices. The net result is a decrease of operational time in this less-reliable state. Additionally, the acceleration of the heating of the one or more non-volatile memory devices to a higher operating temperature may occur such that delay of a boot up procedure of a host system (e.g., the booting up of computing devices within a vehicle) is eliminated. That is, by the time the one or more non-volatile memory devices are accessed to retrieve boot data stored at the one or more non-volatile memory devices, the heating procedure may have already heated the one or more non-volatile memory devices to the higher operating temperatures such that the boot data may be accurately provided (e.g., transmitted) to the host system.

FIG. 1 illustrates an example of a system 100 that supports memory device heating in cold environments in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices and, in some cases, may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may, in some cases, be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-*a* and 130-*b* are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally, or alternatively, include static random-access memory (SRAM) or other memory that may be used by the memory system controller 115 for internal storage or calculations, for example, related to the functions ascribed herein to the memory system controller 115. Additionally, or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally, or alternatively, rely on an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may, in some cases, be performed instead by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally. or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a die 160 (e.g., a memory die). For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally, or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may be performed on different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165-*c*, and 165-*d*, respectively, and blocks 170-*a*, 170-*b*. 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may, in some cases, not be updated until the entire block 170 that includes the page 175 has been erased.

The system 100 may include any quantity of non-transitory computer readable media that support memory device heating in cold environments. For example, the host system 105 (e.g., a host system controller 106), the memory system 110 (e.g., a memory system controller 115), or a memory device 130 (e.g., a local controller 135) may include or otherwise may access one or more non-transitory computer readable media storing instructions (e.g., firmware, logic, code) for performing the functions ascribed herein to the host system 105, the memory system 110, or a memory device 130. For example, such instructions, if executed by the host system 105 (e.g., by a host system controller 106), by the memory system 110 (e.g., by a memory system controller 115), or by a memory device 130 (e.g., by a local controller 135), may cause the host system 105, the memory system 110, or the memory device 130 to perform associated functions as described herein.

In some examples, the memory system 110, the host system 105, or both may be operated in cold temperatures (e.g., near −40° C., among other cold temperatures), such as if implemented in a vehicle or other device which may be subject to cold temperatures. In some cases, access operation reliability of the memory system 110 may be adversely affected by such cold temperatures. For example, a reliability of writing data or reading data from a memory device 130 may decrease as a temperature of the memory device 130 decreases (e.g., an error rate associated with communicating data with the memory device 130 may increase as the temperature decreases). The memory device 130 may warm as the memory system 110 (e.g., the memory system controller 115, the memory device 130) is operated. However, in some cases, the host system 105 may attempt to access data stored at the memory device 130 prior to the memory device 130 heating to a more reliable operating temperature. Thus, a reliability of such access operations may be reduced such that the data fails to be properly read. As a result, operations of the host system 105 that depend on the proper reading of the data (e.g., a boot up procedure of the host system 105 performed in accordance with boot data stored by the memory device 130) may be delayed at least until the memory device 130 is able to heat up to a temperature at which the data may be properly read.

In accordance with examples described herein, the memory system 110 may support a heating procedure to accelerate a heating of one or more components of the memory system 110. For example, the memory system 110 may determine that a temperature of an environment associated with the memory system 110 (e.g., a temperature of the memory system 110, the memory system controller 115, a memory device 130) fails to satisfy (e.g., is less than, less than or equal to) a threshold temperature. Based on (e.g., in response to) the temperature failing to satisfy the threshold, the memory system controller 115 may perform a heating procedure. In some examples, the heating procedure may accelerate a heating of the memory system controller 115, and the heat of the memory system controller 115 may radiate to nearby components of the memory system 110, such as a memory device 130. In some examples, the heating procedure may include operating a heating element located nearby the memory device 130. The heat radiated by the memory system controller 115 (e.g., and/or the heating element) may accelerate a heating of the memory device 130.

The memory system 110 (e.g., the memory system controller 115) may read data from the memory device 130 based on (e.g., after, concurrent with) the heating procedure. For example, the memory device 130 may store data, such as boot data, which may be read before normal operation of the memory system 110 would be able to heat the memory device 130 to reliably read the data. The heating procedure may accelerate the heating of the memory device 130 such that a latency of reliability reading the data and performing operations at the host system 105 using the data may be reduced.

Figure 2:
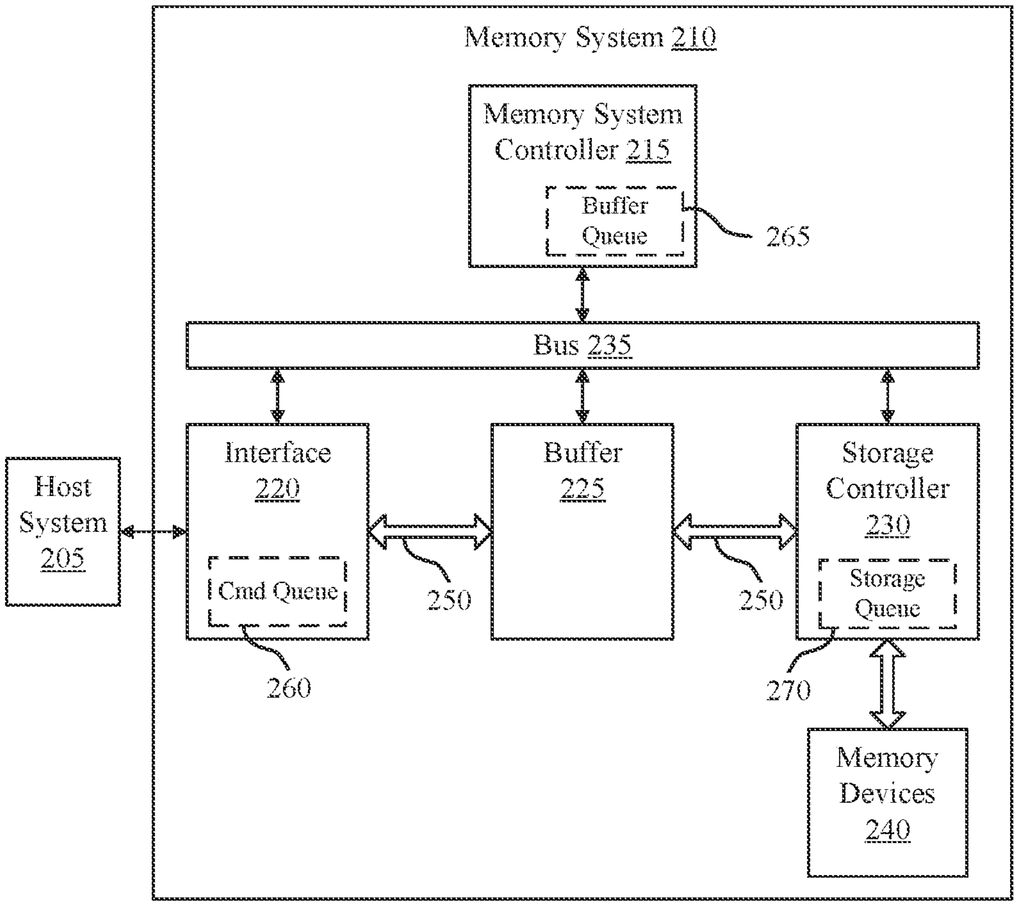

FIG. 2 illustrates an example of a system 200 that supports memory device heating in cold environments in accordance with examples as disclosed herein. The system 200 may be an example of a system 100 as described with reference to FIG. 1, or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include one or more memory devices 240 to store data transferred between the memory system 210 and the host system 205 (e.g., in response to receiving access commands from the host system 205). The memory devices 240 may include one or more memory devices as described with reference to FIG. 1.

The memory system 210 may include a storage controller 230 for controlling the passing of data directly to and from the memory devices 240 (e.g., for storing data, for retrieving data, for determining memory locations in which to store data and from which to retrieve data). The storage controller 230 may communicate with memory devices 240 directly or via a bus (not shown), which may include using a protocol specific to each type of memory device 240. In some cases, a storage controller 230 may implement aspects of a local controller 135 as described with reference to FIG. 1.

The memory system 210 may include an interface 220 for communication with the host system 205, and a buffer 225 for temporary storage of data being transferred between the host system 205 and the memory devices 240. The interface 220, buffer 225, and storage controller 230 may support translating data between the host system 205 and the memory devices 240 (e.g., as shown by a data path 250), and may be collectively referred to as data path components.

Using the buffer 225 to temporarily store data during transfers may allow data to be buffered while commands are being processed, which may reduce latency between commands and may support arbitrary data sizes associated with commands. This may also allow bursts of commands to be handled, and the buffered data may be stored, or transmitted, or both (e.g., after a burst has stopped). The buffer 225 may include relatively fast memory (e.g., some types of volatile memory, such as SRAM or DRAM), or hardware accelerators, or both to allow fast storage and retrieval of data to and from the buffer 225. The buffer 225 may include data path switching components for bi-directional data transfer between the buffer 225 and other components.

A temporary storage of data within a buffer 225 may refer to the storage of data in the buffer 225 during the execution of access commands. For example, after completion of an access command, the associated data may no longer be maintained in the buffer 225 (e.g., may be overwritten with data for additional access commands).

The memory system 210 also may include a memory system controller 215 for executing the commands received from the host system 205, which may include controlling the data path components for the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, a storage queue 270) may be used to control the processing of access commands and the movement of corresponding data. This may be beneficial, for example, if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if implemented, may be positioned anywhere within the memory system 210.

Data transferred between the host system 205 and the memory devices 240 may be conveyed along a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220 (e.g., according to a protocol, such as a UFS protocol or an eMMC protocol). Thus, the interface 220 may be considered a front end of the memory system 210. After receipt of each access command, the interface 220 may communicate the command to the memory system controller 215 (e.g., via the bus 235). In some cases, each command may be added to a command queue 260 by the interface 220 to communicate the command to the memory system controller 215.

After a determination that an access command has been received, the memory system controller 215 may execute the access command. For a read command, this may include obtaining data from one or more memory devices 240 and transmitting the data to the host system 205. For a write command, this may include receiving data from the host system 205 and moving the data to one or more memory devices 240. In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a read command received from the host system 205, the memory system controller 215 may determine if the buffer 225 has sufficient available space to store the data associated with the command. For example, the memory system controller 215 may determine (e.g., via firmware, via controller firmware), an amount of space within the buffer 225 that may be available to store data associated with the read command.

In some cases, the buffer queue 265 may support buffer storage of data associated with read commands in a similar manner as discussed with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215 (e.g., via the bus 235) in response to the data transfer to the buffer 225 being completed.

In some cases, a storage queue 270 may be used to aid with the transfer of read data. For example, the memory system controller 215 may push the read command to the storage queue 270 for processing. In some cases, the storage controller 230 may obtain (e.g., from the buffer 225, from the storage queue 270) the location within one or more memory devices 240 from which to retrieve the data. In some cases, the storage controller 230 may obtain (e.g., from the buffer queue 265) the location within the buffer 225 to store the data. In some cases, the storage controller 230 may obtain (e.g., from the storage queue 270) the location within the buffer 225 to store the data. In some cases, the memory system controller 215 may move the command processed by the storage queue 270 back to the command queue 260.

Once the data has been stored in the buffer 225 by the storage controller 230, the data may be transferred from the buffer 225 and sent to the host system 205. For example, the memory system controller 215 may cause the interface 220 to retrieve the data from the buffer 225 using the data path 250 and transmit the data to the host system 205 (e.g., according to a protocol, such as a UFS protocol or an eMMC protocol). For example, the interface 220 may process the command from the command queue 260 and may indicate to the memory system controller 215 (e.g., via the bus 235) that the data transmission to the host system 205 has been completed.

In some examples, the memory system 210 may be operated at cold temperatures, which may reduce a reliability of data written to and read from the one or more memory devices 240. The memory system controller 215 may perform a heating procedure to accelerate a heating of memory system 210 (e.g., of the one or more memory devices 240). For example, the memory system 210 (e.g., the memory system controller 215) may detect a temperature of an environment associated with the memory system 210 (e.g., an ambient temperature, a temperature of the memory system 210, the memory system controller 215, or the one or more memory devices 24). If the temperature fails to satisfy a threshold (e.g., is less than −40° C., among other temperature thresholds), the memory system controller 215 may perform a heating procedure (e.g., increase a current drawn by the controller, transition to a high power mode, activate a heating element, among other operations described herein) to warm one or more memory devices 240 to an operating temperature at which the one or more memory devices 240 may provide more reliable data, for example, used to boot and operate the host system 205.

Figure 3:
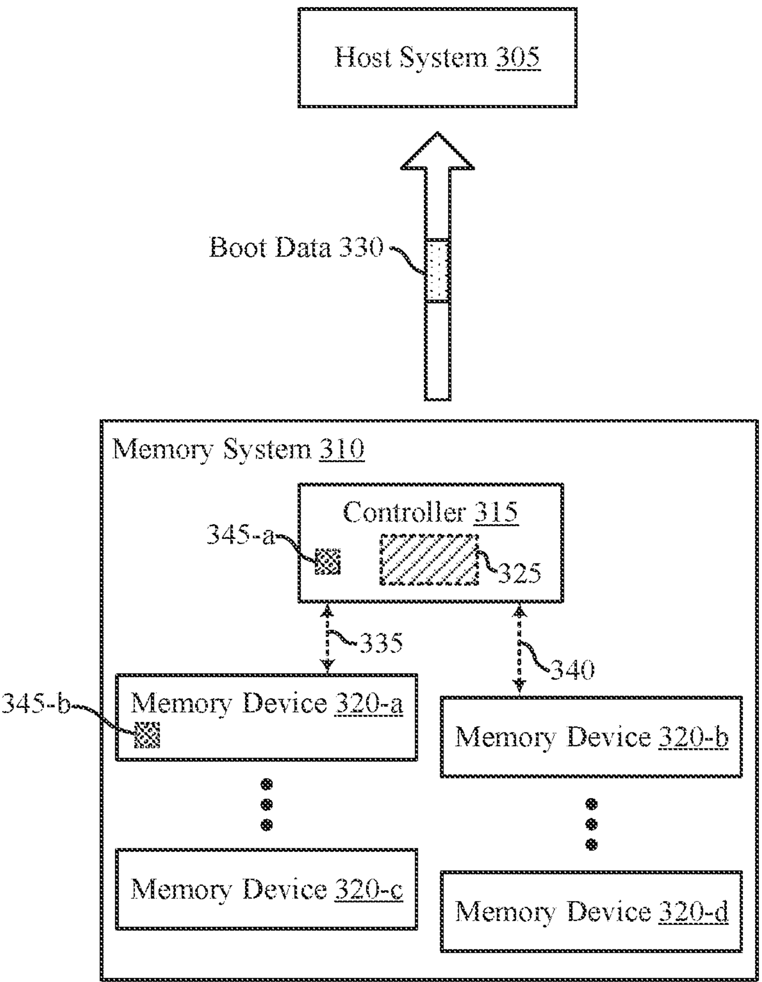

FIG. 3 illustrates an example of a system 300 that supports memory device heating in cold environments in accordance with examples as disclosed herein. The system

300 may implement or be implemented by aspects of the systems 100 or 200 described with reference to FIGS. 1 and 2, respectively. For the example, the system 300 may include a host system 305 and a memory system 310, which may be examples of the corresponding systems described with reference to FIGS. 1 and 2. Additionally, the memory system 310 may include a controller 315, which may be an example of a memory system controller 115 or 215 described with reference to FIGS. 1 and 2. The memory system 310 may also include one or more memory devices 320 (e.g., a memory device 320-*a* through 320-*d*), which may be examples of a memory device 130 or 240 described with reference to FIGS. 1 and 2.

In some examples, the controller 315 may include or be an example of a deep learning accelerator (DLA), a compute express link (CXL) controller, or a combination thereof. In some cases, a DLA may be a device configured to perform tasks such as machine vision, voice recognition, object identification, and natural language processing (e.g., among others), more rapidly while using less power compared to if a general-purpose computer were to perform such tasks, for example, by implementing one or more machine learning models (e.g., neural networks) trained to perform such tasks. In some examples, the DLA may include a processor chipset and a software stack executed by the processor chipset. The processor chipset may include one or more cores, one or more caches (e.g., memory local to or included in the DLA), and a storage protocol controller (e.g., PCIe controller), among other components. In some cases, the DLA may be a field programmable gate array (FPGA) based device, such as a modular FPGA-based architecture that implements an inference engine that may be tuned for various neural networks. In some examples, the DLA may operate multiple neural networks concurrently. In some examples, a neural network may be implemented on a single DLA or across multiple DLAs. The DLA may be trained to perform or support one or more operations of the host system 305 using one or more neural networks.

The memory system 310 may support the storage of data used to support operations performed by the host system 305. For example, the host system 305 may store boot data 330 (e.g., boot code) to the memory system 310 (e.g., or the memory system 310 may otherwise be loaded with the boot data, for example during a manufacturing of the memory system 310). The host system 305 may subsequently access the boot data 330 as part of a boot up procedure at the host system 305. For example, if the host system 305 and memory system 310 are implemented in a vehicle system, the host system 305 may request (e.g., via a read command) that the memory system 310 transmit the boot data 330 to the host system 305 in response to powering on the vehicle system (e.g., starting the vehicle system). The host system 305 may use the boot data 330 to perform a boot up procedure. For example, the boot data 330 may include instructions according to which the host system 305 may boot up one or more systems of or coupled with the host system 305 (e.g., load and run an operating system of the host system 305).

The memory system 310 may store the boot data 330 to a memory device 320. Accordingly, in response to a read command to read the boot data 330, the memory system 310 may access the memory device 320 to obtain the boot data 330 and may transmit the boot data 330 to the host system 305. In some examples, the memory device 320 may be an example of a non-volatile memory device, such as a NAND device, an FeRAM device, or a chalcogenide-based memory device, among other examples of non-volatile memory devices.

In some cases, however, the memory system 310 may operate in cold environments that affect the reliability of accessing and providing the boot data 330 to the host system 305. For example, the memory system 310 may be subject to cold temperatures that cool components of the memory system 310 (e.g., the controller 315, the memory devices 320) to cold temperatures such that bit error rates of data communicated with the memory devices 320 may increase. Operation of the memory system 310 may heat the components of the memory system 310, however, a speed at which the components of the memory system 310 heat up to more reliable temperatures may be insufficient to support reliable transmission of the boot data 330 to the host system 305 within a requested time frame. For example, the host system 305 may request for the memory system 310 to provide the boot data 330 in response to a powering up of the vehicle system. In some cases, the memory system 310 may power up in response to the powering up of the vehicle system and its components may have insufficient time to heat up before being requested to provide the boot data 330.

To accelerate a heating of components of the memory system 310, the controller 315 may perform a heating procedure to intelligently heat one or more memory devices 320 that store the boot data 330 such that the boot data 330 may be reliably provided to the host system 305 with reduced latency (e.g., in accordance with a requested time frame). For example, the memory system 310 may initiate a procedure to transmit the boot data 330 to the host system 305 (e.g., in response to a request from the host system 305). Based on initiating the procedure, the memory system 310 may determine a temperature of an environment associated with the memory system 310 (e.g., an ambient temperature, a temperature of the memory system 310, a temperature of the controller 315, a temperature of the one or more memory devices 320 that store the boot data 330). If the temperature fails to satisfy (e.g., is less than, is less than or equal to) a threshold temperature, the controller 315 may be configured to perform (e.g., initiate) a heating procedure. In some examples, the threshold temperature may be a relatively cold temperature, such as −40° C., although other values for the threshold temperature that affect a reliability of accessing the one or more memory devices 320 may be used (e.g., configured).

In some examples, the memory system 310 may determine that the temperature fails to satisfy the threshold temperature using a temperature sensor 345. For example, the memory system 310 may include one or more temperature sensors 345 and may receive (e.g., retrieve) a value of the temperature from the one or more temperature sensors 345. The memory system 310 may compare the received temperature value to the temperature threshold to determine whether the temperature satisfies the threshold temperature. In some examples, the memory system 310 may include a temperature sensor 345-*a* within the controller 315, a temperature sensor 345-*b* within a memory device 320 (e.g., the memory device 320-*a*, the memory device 320 that stores the boot data 330), or a combination thereof.

The controller 315 may perform various operations in accordance with the heating procedure. For example, the controller 315 may emit (e.g., radiate) heat, which may warm nearby components of the memory system 310, such as one or more nearby memory devices 320 (e.g., the memory device 320-*a*, a memory device 320-*b*). In some examples, the heating procedure may accelerate (e.g., increase) a heating of the controller 315, thereby reducing the time it takes for increased heat to be emitted by the controller 315. The increased heat emitted by the controller 315 may accelerate a heating of the one or more memory devices 320, thereby reducing the time it takes for the one or more memory devices 320 to reach a more reliable temperature such that the boot data 330 may be reliably read and provided to the host system 305.

In some examples, accelerating the heating of the controller 315 may include adjusting a current drawn by the controller 315 to a higher current. For example, as part of the heating procedure, the controller 315 may adjust the current drawn by the controller 315 from a first current to a second current that is greater than the first current. Drawing current may cause the controller 315 heat up and thereby emit heat. The more current that is drawn by the controller 315, the hotter the controller 315 may become and the more heat that the controller 315 may emit. Accordingly, increasing the current drawn by the controller 315 to the second current may cause the controller 315 to emit more heat than is emitted using (e.g., by drawing) the first current (e.g., may accelerate the heating of the controller 315).

In some examples, accelerating the heating of the controller 315 may include transitioning the controller from a first power mode to a second power mode. For example, as part of the heating procedure, the controller 315 may transition from a first power mode associated with a first power consumption to a second power mode associated with a second power consumption. The first power consumption may be less than the second power consumption. For example, consuming power at the controller 315 may cause the controller 315 to heat up and thereby emit heat. The greater the power consumption of the controller 315, the hotter the controller 315 may become and the more heat that the controller 315 may emit. Accordingly, transitioning the controller 315 to the second power mode associated with a higher power consumption, which may cause the controller 315 to emit more heat than is emitted as part of operating in the first power mode. In some examples, increasing a power consumption of the controller 315 may include increasing the current drawn by the controller 315. For example, the controller 315 may draw a higher current if operating in the second power mode than if operating in the first power mode.

In some examples, accelerating the heating of the controller 315 may include operating a heating element 325 included in the controller 315. For example, the controller 315 may include the heating element 325, which may include one or more circuit elements configured to emit heat in response to being operated (e.g., activated). For instance, the heating element 325 may include one or more resistors that may emit heat in response to being operated (e.g., having current passed through). As part of the heating procedure, the controller 315 may be configured to drive a current through the heating element 325, thereby causing the heating element 325 to heat up and emit heat. The heat emitted by the heating element 325 may accelerate a heating of the controller 315 and cause increased heat to be emitted by the controller 315 relative to normal operation of the controller 315 without operation of the heating element 325.

The one or more memory devices 320 to which the boot data 330 is stored may be strategically selected to increase an effectiveness of the heating procedure. For example, the memory system 310 may store the boot data 330 to the one or more memory devices 320 based on a proximity of the one or more memory devices 320 to the controller 315 (e.g., a distance between the one or more memory devices 320 and the controller 315). For instance, the closer that a memory device 320 is to the controller 315, the more (e.g., faster) the heat emitted by the controller 315 may heat the memory device 320, and the faster the memory device 320 may warm to a higher temperature. Thus, the boot data 330 may be stored to one or more memory devices 320 having a relatively closer proximity to the controller 315 than other memory devices 320 of the memory system 310, for example, to reduce a time it takes to be able to reliably access the boot data 330.

In the example of FIG. 3, the memory system 310 may store the boot data 330 to the memory device 320-*a*. In some examples, the memory system 310 may store the boot data 330 to the memory device 320-*a* based on the memory device 320-*a* being a physically nearest (e.g., closest) memory device 320 to the controller 315 (e.g., the heating element 325 in the controller 315) of the memory devices 320 included in the memory system 310. For example, the memory device 320-*a* may be located a distance 335 from the controller 315 (e.g., the heating element 325). A next physically nearest memory device 320-*b* of the memory system 310 may be located a distance 340 from the controller 315, which may be greater than the distance 335. The memory system 310 may select the memory device 320-*a* to store the boot data 330 based on the distance 335 being less than the distance 340, for example, because the memory device 320-*a* may be warmed faster than the memory device 320-*b* as a result of the heating procedure based on being located closer to the controller 315. In some examples, if respective portions of the boot data 330 are to be stored at multiple memory devices 320, the memory system 310 may select the physically closest memory devices 320 to store the respective portions.

In some examples, the memory system 310 may store the boot data 330 to the memory device 320-*a* based on the memory device 320-*a* being located within a threshold physical distance of the controller 315 (e.g., the heating element 325). For example, the memory system 310 may select the memory device 320-*a* to store the boot data based on the distance 335 being less than (e.g., or equal to) the threshold physical distance. In some examples, if another memory device 320 is also located within the threshold physical distance (e.g., the distance 340 is within the threshold physical distance), the memory system 310 may select the memory device 320 that is physically closer to the controller 315 to store the boot data 330.

In some examples, the memory system 310 may select the memory device 320-*a* to store the boot data 330 based on the boot data 330 being flagged as boot data. For example, the memory system 310 may receive the boot data 330 (e.g., from the host system 305) to write to one or more memory devices 320. The boot data 330 may include an indication that it is associated with the boot up procedure at the host system 305 (e.g., that it is boot data). Based on the indication, in the example of FIG. 3, the memory system 310 may select the memory device 320-*a* in accordance with the proximity of the memory device 320-*a* to the controller 315 (e.g., the heating element 325) and may store the boot data 330 to the memory device 320-*a*.

The memory system 310 may read the boot data 330 from the memory device 320-*a* for transmission to the host system 305 based on the heating procedure. For example, the memory system 310 may initiate the heating procedure before the boot data 330 is read from the memory device 320-*a*. Accordingly, the heating procedure may increase a temperature of the memory device 320-*a*, which may increase a reliability of (e.g., a fidelity of) a read operation to read the boot data 330. In some examples, the memory system 310 (e.g., the controller 315) may read the boot data 330 after a termination of the heating procedure. In some examples, the memory system 310 may read the boot data 330 concurrent with the heating procedure being performed (e.g., at some time after initiation of the heating procedure and while the heating procedure is ongoing). Based on reading the boot data 330 from the memory device 320-*a*, the memory system 310 may transmit the boot data 330 to the host system 305.

The memory system 310 (e.g., the controller 315) may be configured to terminate (e.g., end, cease) the heating procedure. For example, performing the heating procedure may increase a power consumption of the memory system 310. Such increased power consumption may accelerate the heating of components of the memory system 310, however, the increased power consumption may be unnecessary as the components reach higher temperatures or, for example, after the boot data 330 is transmitted to the host system 305. For instance, after the components (e.g., the controller 315, the memory device 320-*a*) reach a higher temperature, the memory system 310 may rely on normal operation to continue to heat the components of the memory system 310.

In some examples, the memory system 310 may terminate the heating procedure (e.g., adjust the current drawn by the controller 315 back to the first current, transition the controller 315 back to the first power mode, cease operation of the heating element 325) based on the temperature satisfying (e.g., being greater than, being greater than or equal to) a second threshold temperature that is greater than the threshold temperature. For example, the memory system 310 may receive a second value of the temperature from a temperature sensor 345 that satisfies the second threshold temperature. In response to the second value of the temperature satisfying the second threshold temperature, the memory system 310 may terminate the heating procedure. In this way, the memory system 310 may temporarily (e.g., and artificially) increase the power consumption of the memory system 310 to accelerate self-heating and then terminate the increased power consumption to avoid wasting power.

In some examples, the memory system 310 may terminate the heating procedure based on transmitting the boot data 330 to the host system 305. For example, after transmission of the boot data 330, operational self-heating in accordance with normal operation of the memory system 310 may be sufficient to support reliably providing data stored at the memory system 310 to the host system 305. In some examples, to avoid wasting power, the memory system 310 may terminate the heating procedure in response to transmitting the boot data 330 to the host system 305.

Figure 4:
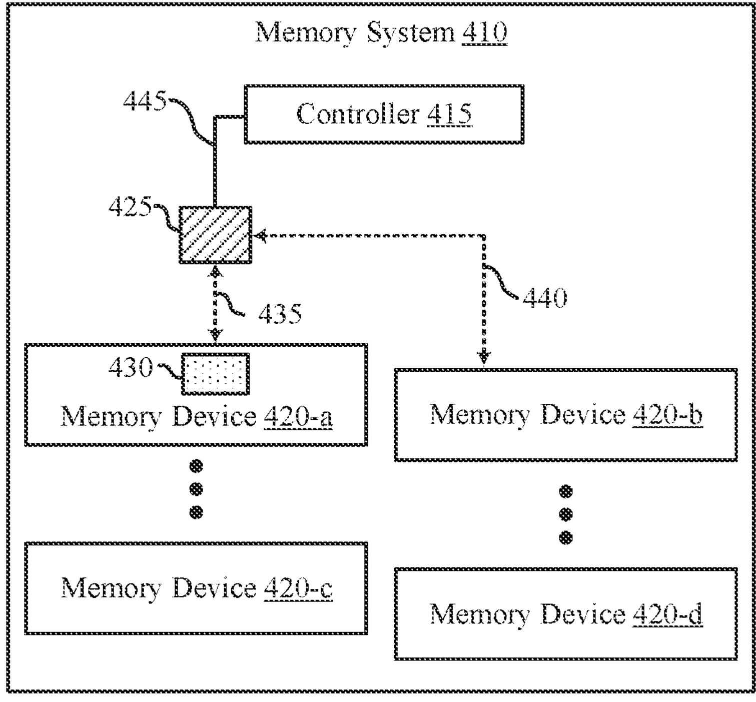

FIG. 4 illustrates an example of a system 400 that supports memory device heating in cold environments in accordance with examples as disclosed herein. The system 400 may implement or be implemented by aspects of the systems 100, 200, or 300 described with reference to FIGS. 1 through 3, respectively. For the example, the system 400 may include a memory system 410, which may be an example of a memory system 110, 210, or 310 described with reference to FIGS. 1 through 3. Additionally, the memory system 410 may include a controller 415 and one or more memory devices 420 (e.g., memory devices 420-*a* through 420-*d*), which may be examples of the corresponding devices described with reference to FIGS. 1 through 3.

The controller 415 may support performing a heating procedure to accelerate a heating of components of the memory system 410 such that boot data 430 stored at one or more memory devices 420 may be reliably transmitted to a host system, as described with reference to FIG. 3. In the example of FIG. 4, the controller 415 may be coupled with a heating element 425 (e.g., via a conductive line 445), which may be an example of a heating element 325 described with reference to FIG. 3. The controller 415 may use the heating element 425 to perform the heating procedure (e.g., drive a current through the heating element 425).

In some examples, the memory system 410 may store the boot data 430 to the one or more memory devices 420 based on a proximity of the one or more memory devices 420 to the heating element 425. For example, the memory device 420-*a* may be located a distance 435 from a location (e.g., position) of the heating element 425. A memory device 420-*b* may be located a distance 440 from the heating element 425, the distance 440 being greater than the distance 435. In the example of FIG. 4, the memory system 410 may select the memory device 420-*a* to store the boot data 430 based on the memory device 420-*a* being located within a threshold physical distance of the heating element 425, being the physically nearest memory device 420 to the heating element 425, or a combination thereof.

In some examples, the heating element 425 may be positioned physically near to one or more memory devices 420 within the memory system 410 to support effective heating of the one or more memory devices 420 as part of the heating procedure. For example, the heating element 425 may be positioned within the threshold physical distance of the memory device 420-*a*, nearest to the memory device 420-*a*, or a combination thereof. In some examples, the heating element 425 may be positioned adjacent to a portion of the memory device 420-*a* that stores the boot data 430. For example, the heating element 425 may be positioned next to (e.g., nearest to) the portion of the memory device 420-*a* configured to store the boot data 430. Such positioning of the heating element 425 may further accelerate a heating of the memory device 420-*a* (e.g., the portion of the memory device 420-*a*) based on operation of the heating element 425, thereby further increasing a likelihood that the boot data 430 is able to be properly read and transmitted to the host system.

Figure 5:
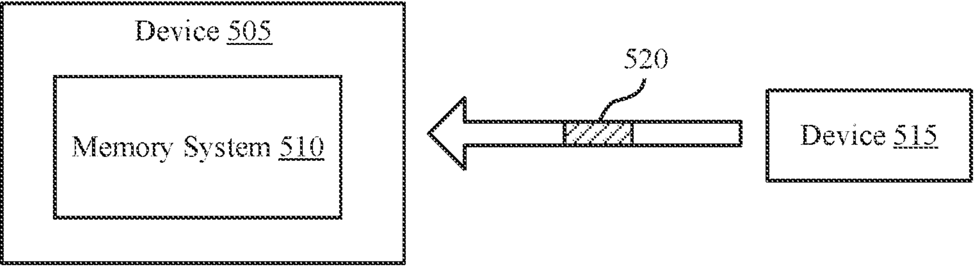

FIG. 5 illustrates an example of a system 500 that supports memory device heating in cold environments in accordance with examples as disclosed herein. The system 500 may implement or be implemented by aspects of the systems 100, 200, 300, or 400 described with reference to FIGS. 1 through 4, respectively. For the example, the system 500 may include a memory system 510, which may be an example of a memory system 110, 210, 310, or 410 described with reference to FIGS. 1 through 4.

The system 500 may include a device 505 that includes the memory system 510. The device 505 may be a device that is subject to cold temperatures, such as a vehicle or other device that may encounter cold temperatures. The memory system 510 may support performing a heating procedure to intelligently heat one or more memory devices of the memory system 510. For example, the memory system 510 may perform the heating procedure to heat the one or more memory devices such that boot data may be reliably provided to a host system (e.g., one or more components of the device 505, such as an infotainment system, among others) as described herein.

The memory system 510 may trigger the heating procedure based on various conditions. In the example of FIG. 5, the memory system may trigger the heating procedure in response to an indication 520 received from a device 515. For example, the device 515 may be a device remote to (e.g., separate from) the device 505. In some examples in which the device 505 is a vehicle, the device 515 may be a key fob, a cell phone, an Internet of Things device, or some other device which may wirelessly communicate with the memory system 510 (e.g., the device 505). The device 515 may transmit the indication 520 to the memory system 510 (e.g., via a wireless communication link with the device 505 or the memory system 510) that triggers the heating procedure. That is, the memory system 510 may perform the heating procedure in response to the indication 520.

The indication 520 may be a precognition indication that the memory system 510 is likely to be operated in the near future. For example, the indication 520 may be sent to the memory system 510 a relatively short time before the device 505 is to be operated and boot data stored at the memory system 510 is to be retrieved. As a result, the heating procedure may be initiated in response to the indication 520 before the initiation of a boot up procedure (e.g., before a host system requests for the boot data from the memory system 510). Transmitting the indication 520 before the initiation of a procedure to transmit the boot data to the host system may provide even more time for the memory system 510 to heat prior to reading the boot data for transmission to the host system, thereby further increasing a reliability of a read operation to read the boot data.

Figure 6:
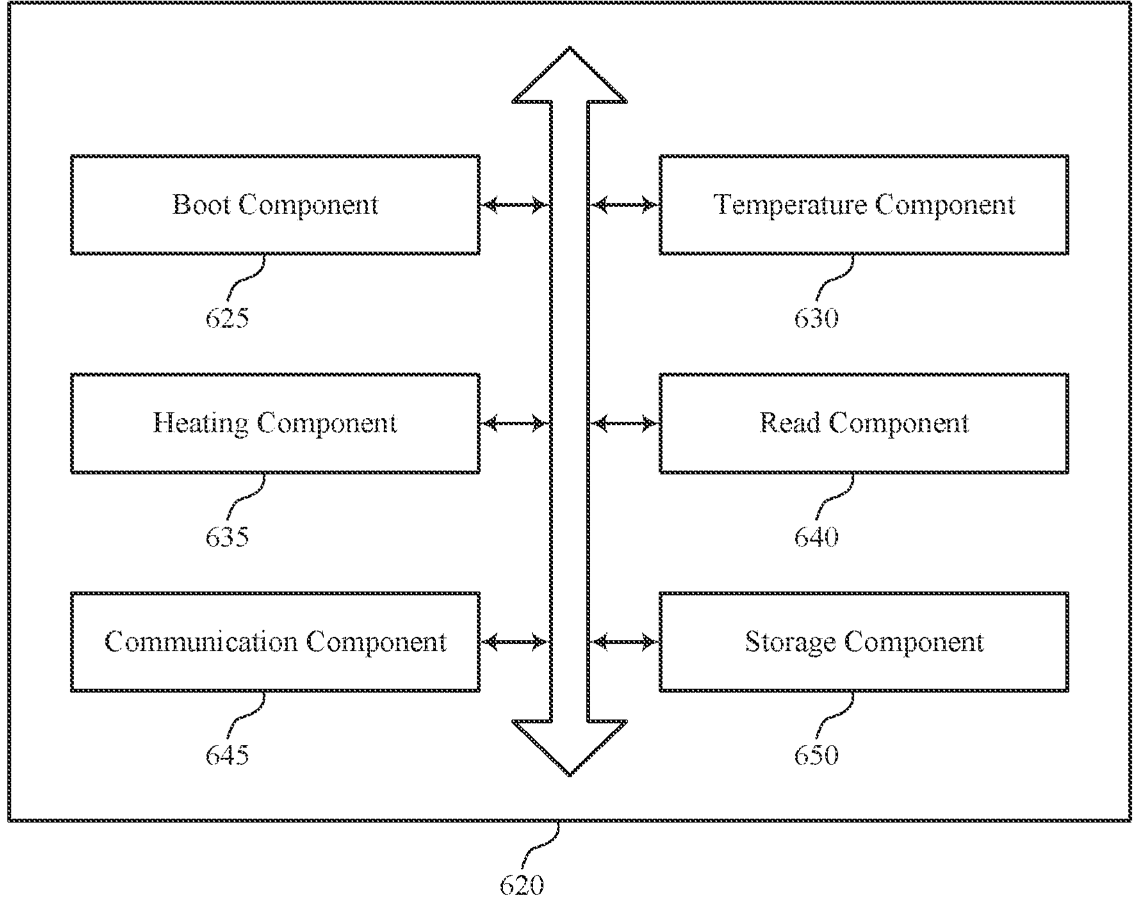
FIG. 6 shows a block diagram of a memory system that supports memory device heating in cold environments in accordance with examples as disclosed herein.

FIG. 6 shows a block diagram 600 of a memory system 620 that supports memory device heating in cold environments in accordance with examples as disclosed herein. The memory system 620 may be an example of aspects of a memory system as described with reference to FIGS. 1 through 4. The memory system 620, or various components thereof, may be an example of means for performing various aspects of memory device heating in cold environments as described herein. For example, the memory system 620 may include a boot component 625, a temperature component 630, a heating component 635, a read component 640, a communication component 645, a storage component 650, or any combination thereof. Each of these components may communicate, directly or indirectly, with one another (e.g., via one or more buses).

The boot component 625 may be configured as or otherwise support a means for initiating, at a memory system, a procedure to transmit boot data to a host system, the boot data associated with a boot up procedure at the host system. The temperature component 630 may be configured as or otherwise support a means for determining, based at least in part on initiating the procedure, that a temperature of an environment associated with the memory system fails to satisfy a threshold. The heating component 635 may be configured as or otherwise support a means for performing, by a controller of the memory system, a heating procedure based at least in part on the temperature failing to satisfy the threshold. The read component 640 may be configured as or otherwise support a means for reading the boot data from a non-volatile memory device of the memory system based at least in part on the heating procedure. The communication component 645 may be configured as or otherwise support a means for transmitting the boot data to the host system.

In some examples, to support performing the heating procedure, the heating component 635 may be configured as or otherwise support a means for adjusting a current drawn by the controller from a first current to a second current, where the second current is greater than the first current and causes the controller to emit more heat than is emitted using the first current.

In some examples, to support performing the heating procedure, the heating component 635 may be configured as or otherwise support a means for transitioning the controller from a first power mode to a second power mode, the first power mode associated with a first power consumption that is less than a second power consumption associated with the second power mode.

In some examples, to support performing the heating procedure, the heating component 635 may be configured as or otherwise support a means for driving a current through a heating element coupled with the controller.

In some examples, the heating element is positioned adjacent to a portion of the non-volatile memory device that stores the boot data.

In some examples, the heating element is positioned within a threshold physical distance from a portion of the non-volatile memory device that stores the boot data.

In some examples, the heating element includes a resistor.

In some examples, the controller includes the heating element.

In some examples, the storage component 650 may be configured as or otherwise support a means for storing the boot data to the non-volatile memory device based at least in part on the non-volatile memory device being located within a threshold physical distance of the controller.

In some examples, the storage component 650 may be configured as or otherwise support a means for selecting the non-volatile memory device to store the boot data based at least in part on an indication that the boot data is associated with the boot up procedure.

In some examples, the storage component 650 may be configured as or otherwise support a means for storing the boot data to the non-volatile memory device based on the non-volatile memory device being a physically nearest non-volatile memory device to the controller of a set of non-volatile memory devices included in the memory system.

In some examples, the storage component 650 may be configured as or otherwise support a means for selecting the non-volatile memory device to store the boot data based at least in part on an indication that the boot data is associated with the boot up procedure.

In some examples, to support determining that the temperature fails to satisfy a threshold, the temperature component 630 may be configured as or otherwise support a means for receiving a value of the temperature from a temperature sensor included in the memory system. In some examples, to support determining that the temperature fails to satisfy a threshold, the temperature component 630 may be configured as or otherwise support a means for comparing the value of the temperature to the threshold.

In some examples, the temperature sensor is included within the non-volatile memory device or the controller.

In some examples, the heating component 635 may be configured as or otherwise support a means for terminating, by the controller, the heating procedure based at least in part on the temperature satisfying a second threshold, the second threshold being greater than the threshold.

In some examples, the controller includes a DLA, a CXL controller, or a combination thereof.

In some examples, the non-volatile memory device includes NAND memory cells, ferroelectric non-volatile memory cells (e.g., FeRAM memory cells), chalcogenide-based memory cells, or a combination thereof.

Figure 7:
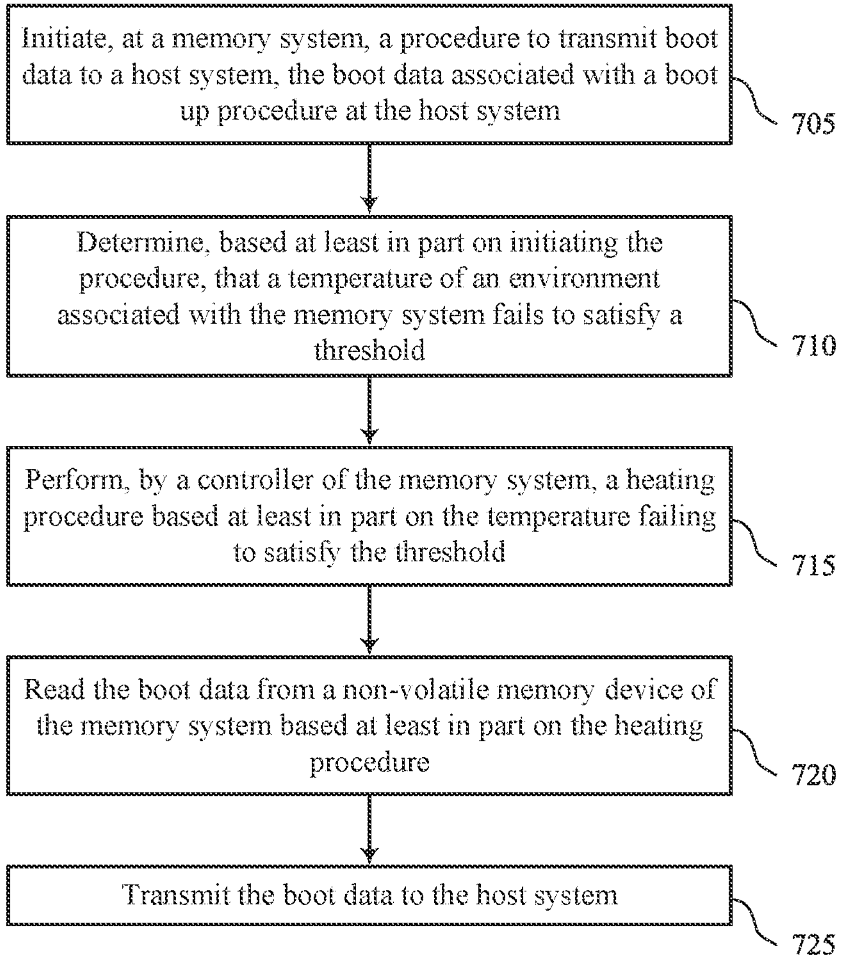
FIG. 7 shows a flowchart illustrating a method or methods that support memory device heating in cold environments in accordance with examples as disclosed herein.

FIG. 7 shows a flowchart illustrating a method 700 that supports memory device heating in cold environments in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally, or alternatively, the memory system may perform aspects of the described functions using special-purpose hardware.

At 705, the method may include initiating, at a memory system, a procedure to transmit boot data to a host system, the boot data associated with a boot up procedure at the host system. The operations of 705 may be performed in accordance with examples as disclosed herein. In some examples, aspects of the operations of 705 may be performed by a boot component 625 as described with reference to FIG. 6.

At 710, the method may include determining, based at least in part on initiating the procedure, that a temperature of an environment associated with the memory system fails to satisfy a threshold. The operations of 710 may be performed in accordance with examples as disclosed herein. In some examples, aspects of the operations of 710 may be performed by a temperature component 630 as described with reference to FIG. 6.

At 715, the method may include performing, by a controller of the memory system, a heating procedure based at least in part on the temperature failing to satisfy the threshold. The operations of 715 may be performed in accordance with examples as disclosed herein. In some examples, aspects of the operations of 715 may be performed by a heating component 635 as described with reference to FIG. 6.

At 720, the method may include reading the boot data from a non-volatile memory device of the memory system based at least in part on the heating procedure. The operations of 720 may be performed in accordance with examples as disclosed herein. In some examples, aspects of the operations of 720 may be performed by a read component 640 as described with reference to FIG. 6.

At 725, the method may include transmitting the boot data to the host system. The operations of 725 may be performed in accordance with examples as disclosed herein. In some examples, aspects of the operations of 725 may be performed by a communication component 645 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for initiating, at a memory system, a procedure to transmit boot data to a host system, the boot data associated with a boot up procedure at the host system; determining, based at least in part on initiating the procedure, that a temperature of an environment associated with the memory system fails to satisfy a threshold; performing, by a controller of the memory system, a heating procedure based at least in part on the temperature failing to satisfy the threshold; reading the boot data from a non-volatile memory device of the memory system based at least in part on the heating procedure; and transmitting the boot data to the host system.

Aspect 2: The method, apparatus, or non-transitory computer-readable medium of aspect 1, where performing the heating procedure includes operations, features, circuitry, logic, means, or instructions, or any combination thereof for adjusting a current drawn by the controller from a first current to a second current, where the second current is greater than the first current and causes the controller to emit more heat than is emitted using the first current.

Aspect 3: The method, apparatus, or non-transitory computer-readable medium of any of aspects 1 through 2, where performing the heating procedure includes operations, features, circuitry, logic, means, or instructions, or any combination thereof for transitioning the controller from a first power mode to a second power mode, the first power mode associated with a first power consumption that is less than a second power consumption associated with the second power mode.

Aspect 4: The method, apparatus, or non-transitory computer-readable medium of any of aspects 1 through 3, where performing the heating procedure includes operations, features, circuitry, logic, means, or instructions, or any combination thereof for driving a current through a heating element coupled with the controller.

Aspect 5: The method, apparatus, or non-transitory computer-readable medium of aspect 4, where the heating element is positioned adjacent to a portion of the non-volatile memory device that stores the boot data.

Aspect 6: The method, apparatus, or non-transitory computer-readable medium of any of aspects 4 through 5, where the heating element is positioned within a threshold physical distance from a portion of the non-volatile memory device that stores the boot data.

Aspect 7: The method, apparatus, or non-transitory computer-readable medium of any of aspects 4 through 6, where the heating element includes a resistor.

Aspect 8: The method, apparatus, or non-transitory computer-readable medium of any of aspects 4 through 7, where the controller includes the heating element.

Aspect 9: The method, apparatus, or non-transitory computer-readable medium of any of aspects 1 through 8, further including operations, features, circuitry, logic, means, or instructions, or any combination thereof for storing the boot data to the non-volatile memory device based at least in part on the non-volatile memory device being located within a threshold physical distance of the controller.

Aspect 10: The method, apparatus, or non-transitory computer-readable medium of aspect 9, further including operations, features, circuitry, logic, means, or instructions, or any combination thereof for selecting the non-volatile memory device to store the boot data based at least in part on an indication that the boot data is associated with the boot up procedure.

Aspect 11: The method, apparatus, or non-transitory computer-readable medium of any of aspects 1 through 10, further including operations, features, circuitry, logic, means, or instructions, or any combination thereof for storing the boot data to the non-volatile memory device based at least in part on the non-volatile memory device being a physically nearest non-volatile memory device to the controller of a set of non-volatile memory devices included in the memory system.

Aspect 12: The method, apparatus, or non-transitory computer-readable medium of aspect 11, further including operations, features, circuitry, logic, means, or instructions, or any combination thereof for selecting the non-volatile memory device to store the boot data based at least in part on an indication that the boot data is associated with the boot up procedure.

Aspect 13: The method, apparatus, or non-transitory computer-readable medium of any of aspects 1 through 12, where determining that the temperature fails to satisfy a threshold includes operations, features, circuitry, logic, means, or instructions, or any combination thereof for receiving a value of the temperature from a temperature sensor included in the memory system and comparing the value of the temperature to the threshold.

Aspect 14: The method, apparatus, or non-transitory computer-readable medium of aspect 13, where the temperature sensor is included within the non-volatile memory device or the controller.

Aspect 15: The method, apparatus, or non-transitory computer-readable medium of any of aspects 1 through 14, further including operations, features, circuitry, logic, means, or instructions, or any combination thereof for terminating, by the controller, the heating procedure based at least in part on the temperature satisfying a second threshold, the second threshold being greater than the threshold.

Aspect 16: The method, apparatus, or non-transitory computer-readable medium of any of aspects 1 through 15, where the controller includes a DLA, a CXL controller, or a combination thereof.

Aspect 17: The method, apparatus, or non-transitory computer-readable medium of any of aspects 1 through 16, where the non-volatile memory device includes NAND memory cells, ferroelectric non-volatile memory cells (e.g., FeRAM memory cells), chalcogenide-based memory cells, or a combination thereof.

It should be noted that the described techniques include possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The term "in response to" may refer to one condition or action occurring at least partially, if not fully, as a result of a previous condition or action. For example, a first condition or action may be performed, and second condition or action may at least partially occur as a result of the previous condition or action occurring (whether directly after or after one or more other intermediate conditions or actions occurring after the first condition or action).

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, the described functions can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:

storing boot data to a non-volatile memory device from among a plurality of non-volatile memory devices within a memory system based at least in part on the non-volatile memory device being located within a threshold physical distance of a controller of the memory system;

initiating, at a memory system, a procedure to transmit the boot data to a host system, the boot data associated with a boot up procedure at the host system;

determining, based at least in part on initiating the procedure, that a temperature of an environment associated with the memory system fails to satisfy a threshold;

performing, by the controller, a heating procedure based at least in part on the temperature failing to satisfy the threshold;

reading the boot data from the non-volatile memory device of the memory system based at least in part on the heating procedure; and transmitting the boot data to the host system.

2. The method of claim 1, wherein performing the heating procedure comprises:

adjusting a current drawn by the controller from a first current to a second current, wherein the second current is greater than the first current and causes the controller to emit more heat than is emitted using the first current.

3. The method of claim 1, wherein performing the heating procedure comprises:

transitioning the controller from a first power mode to a second power mode, the first power mode associated with a first power consumption that is less than a second power consumption associated with the second power mode.

4. The method of claim 1, wherein performing the heating procedure comprises:

driving a current through a heating element coupled with the controller.

5. The method of claim 4, wherein the heating element is positioned adjacent to a portion of the non-volatile memory device that stores the boot data.

6. The method of claim 4, wherein the heating element is positioned within a threshold physical distance from a portion of the non-volatile memory device that stores the boot data.

7. The method of claim 4, wherein the heating element comprises a resistor.

8. The method of claim 1, further comprising:

selecting the non-volatile memory device to store the boot data based at least in part on an indication that the boot data is associated with the boot up procedure.

9. The method of claim 1, further comprising:

storing the boot data to the non-volatile memory device based at least in part on the non-volatile memory device being a physically nearest non-volatile memory device to the controller of a set of non-volatile memory devices included in the memory system.

10. The method of claim 9, further comprising:

selecting the non-volatile memory device to store the boot data based at least in part on an indication that the boot data is associated with the boot up procedure.

11. The method of claim 1, wherein determining that the temperature fails to satisfy the threshold comprises:

receiving a value of the temperature from a temperature sensor included in the memory system; and comparing the value of the temperature to the threshold.

12. The method of claim 11, wherein the temperature sensor is included within the non-volatile memory device or the controller.

13. The method of claim 1, further comprising:

terminating, by the controller, the heating procedure based at least in part on the temperature satisfying a second threshold, the second threshold being greater than the threshold.

14. The method of claim 1, wherein the controller comprises a deep learning accelerator (DLA), a compute express link (CXL) controller, or a combination thereof.

15. The method of claim 1, wherein the non-volatile memory device comprises not-and (NAND) memory cells, ferroelectric non-volatile memory cells, chalcogenide-based memory cells, or a combination thereof.

16. An apparatus, comprising:

a non-volatile memory device; and a controller coupled with the non-volatile memory device, wherein the controller is configured to cause the apparatus to:

store boot data to a non-volatile memory device from among a plurality of non-volatile memory devices within a memory system based at least in part on the non-volatile memory device being located within a threshold physical distance of a controller of the memory system;

initiate, at the apparatus, a procedure to transmit the boot data to a host system, the boot data associated with a boot up procedure at the host system;

determine, based at least in part on initiating the procedure, that a temperature of an environment associated with the apparatus fails to satisfy a threshold;

perform, by the controller, a heating procedure based at least in part on the temperature failing to satisfy the threshold;

read the boot data from the non-volatile memory device based at least in part on the heating procedure; and transmit the boot data to the host system.

17. The apparatus of claim 16, wherein performing the heating procedure is configured to cause the apparatus to:

adjust a current drawn by the controller from a first current to a second current, wherein the second current is greater than the first current and causes the controller to emit more heat than is emitted using the first current.

18. The apparatus of claim 16, wherein performing the heating procedure is configured to cause the apparatus to:

transition the controller from a first power mode to a second power mode, the first power mode associated with a first power consumption that is less than a second power consumption associated with the second power mode.

19. A non-transitory computer-readable medium storing code, the code comprising instructions executable by a processor to:

store boot data to a non-volatile memory device from among a plurality of non-volatile memory devices within a memory system based at least in part on the non-volatile memory device being located within a threshold physical distance of a controller of the memory system;

initiate, at the memory system, a procedure to transmit the boot data to a host system, the boot data associated with a boot up procedure at the host system;

determine, based at least in part on initiating the procedure, that a temperature of an environment associated with the memory system fails to satisfy a threshold;

perform, by the controller of the memory system, a heating procedure based at least in part on the temperature failing to satisfy the threshold;

read the boot data from the non-volatile memory device of the memory system based at least in part on the heating procedure; and transmit the boot data to the host system.

* * * * *